United States Patent [19]
Hayashi

[11] Patent Number: 5,293,520
[45] Date of Patent: Mar. 8, 1994

[54] JITTER ANALYZER

[75] Inventor: Mishio Hayashi, Ohsato, Japan

[73] Assignee: Advantest Corporation, Tokyo, Japan

[21] Appl. No.: 960,852

[22] Filed: Oct. 14, 1992

[30] Foreign Application Priority Data

Oct. 18, 1991 [JP] Japan .................. 3-270726

[51] Int. Cl.$^5$ .............. G01R 29/02; G11B 20/18
[52] U.S. Cl. ................ 324/76.77; 324/617;
324/76.24; 324/76.38; 364/723
[58] Field of Search .......... 364/723; 328/129.1,
328/130.1, 109, 111; 324/617, 76.24, 76.38,
76.77

[56] References Cited

U.S. PATENT DOCUMENTS

| | | | |
|---|---|---|---|
| 4,074,358 | 2/1978 | Caputo et al. | 364/514 |
| 4,253,184 | 2/1981 | Gitlin | 375/14 |
| 4,800,571 | 1/1989 | Konishi | 364/514 |
| 4,876,655 | 10/1989 | Carlton | 364/487 |

FOREIGN PATENT DOCUMENTS

| | | |
|---|---|---|
| 0277638 | 8/1988 | European Pat. Off. . |
| 80786 | 5/1985 | Japan . |
| 284268 | 12/1987 | Japan . |
| 117272 | 5/1988 | Japan . |

OTHER PUBLICATIONS

Patent Abstracts of Japan, vol. 12, No. 173 (P-706), May 24, 1993, & JP-A-62-284 268 (Advantest), Dec. 10, 1987, Abstract only.
Patent Abstracts of Japan, vol. 12, No. 188 (P-711), Jun. 2, 1988, & JP-A-62-294 993 (Advantest), Nov. 22, 1987, Abstract only.
Technisches Messen TM, vol. 53, No. 6, 1976, Munchen De, pp. 215-219, Nawrocki et al., "Personal-Computer als Klirrfaktormessgerät" (no month).

*Primary Examiner*—Kenneth A. Wieder
*Assistant Examiner*—Jose M. Solis
*Attorney, Agent, or Firm*—Staas & Halsey

[57] ABSTRACT

Periods $P_k$ between the one edges of input pulses are measured one after another by a successive period measuring circuit, and at the same time, the time interval between the one edge to the other of each input pulse, that is, a pulse width $W_k$, is measured by a time interval measuring circuit. The measured periods are sequentially accumulated and each accumulated value is made to correspond to each pulse, as the time at which the measurement of its pulse width was started. In an interpolation part, pulse widths, which are assumed to be obtained at regular time intervals, are computed, by an interpolation method, from the sequence of measured pulse widths and the their measurement starting times. In a Fourier transform part, the pulse width data obtained by the interpolation is subjected to a Fourier transform to obtain the frequency components of a pulse width jitter.

10 Claims, 8 Drawing Sheets

| | S1 | S2 | S3 | S4 |
|---|---|---|---|---|
| PERIOD | a: ⊓ ↕ ⊔<br>b: ⊓ ↕ ⊔ | | a<br>b | b<br>a |
| FREQ | a: ⊓ ↕ ⊔<br>b: ⊓ ↕ ⊔ | | a<br>b | b<br>a |
| WIDTH | a: ⊓⊔<br>b: ⊓⊔ | | a | b |
| DUTY | a: ⊓⊔<br>b: ⊓⊔ | | a | b |
| INTERVAL | a: START ⇥<br>b: START ⇥ | a: STOP ⇤<br>b: STOP ⇤ | a | c |
| PHASE | a:<br>b: | a: ⊓ ↕ ⊔<br>b: ⊓ ↕ ⊔ | a | c |

JITTER ANALYZER

BACKGROUND OF THE INVENTION

The present invention relates to a jitter analyzer for analyzing what are called jitters of input pulses, such as the pulse width fluctuation and pulse repetition period fluctuation.

It is coded pulse train signals that are reproduced, for example, in a magnetic disk unit for use as an external storage of a personal computer, a digital audio apparatus called a compact disk apparatus, or a video apparatus such as a laser disk apparatus. If a jitter is contained in such a coded pulse train signal, an error is likely to occur during decoding of the signal. The occurrence of an error is not allowed in the case of an external storage of a computer, in particular. In the case of determining if these digital apparatuses are good or defective, it is therefore necessary to measure whether the jitter of the pulse train signal stays within a given limit or not.

Figure 1:
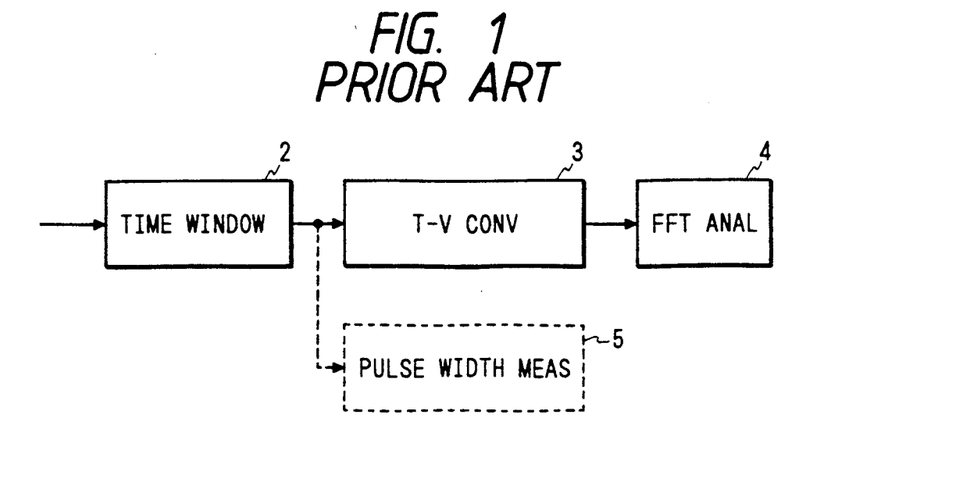
FIG. 1 is a block diagram showing a conventional jitter analyzer.

In Japanese Patent Application Public Disclosure No. 284268/87 the inventor of this application proposes a pulse width fluctuation analyzer. FIG. 1 shows its basic construction in a simplified form. Input pulses are applied to a time window 2, whereby pulses of a particular pulse width are sequentially extracted or selected from among pulses of various pulse widths which are substantially integral multiples of a unit pulse length, and the selected pulses are converted by a time-to-voltage (hereinafter referred to as T-V) converter 3 to voltages corresponding to the pulse widths. The voltage thus converted for each pulse is provided to an ordinary fast Fourier transform (FFT) analyzer 4, wherein it is subjected to a fast Fourier transform for analysis. In this way, pulse width fluctuations or jitter components of the input pulses can be detected, and in particular, even if the jitters vary with a plurality of periods, components of the respective periods can be detected, which can be used to ascertain the cause for the occurrence of each jitter.

With the T-V converter 12 which simply integrates reference clock pulses for the duration of the input pulse as in the above-mentioned Japanese patent public disclosure, it is impossible to achieve a high precision time-to-voltage conversion, for example, with a resolution of 100 ps. In practice, as proposed by the inventor of this application in Japanese Patent Application Public Disclosure No. 294993/87, for instance, a constant voltage is integrated for a fractional or odd period $\Delta T_1$ from the rise of a certain input pulse to the rise of a clock pulse immediately thereafter and for a fractional or odd period $\Delta T_2$ from the fall of the input pulse to the rise of a clock pulse immediately thereafter to thereby obtain voltages corresponding to odd or fractional components of the clock pulses at the rise and fall of the input pulse, respectively, the voltage at the fall of the input pulse is subtracted from the voltage at the rise thereof to obtain a difference voltage, and the number of rises of the clock pulses, counted from the end of the fractional period $\Delta T_1$ to the end of the fractional period $\Delta T_2$, is converted by a D-A converter to the corresponding voltage. The sum voltage, obtained by adding the difference voltage and the voltage corresponding to the clock count value, is sampled and held, as a voltage corresponding to the width of the input pulse, by a sample-hold circuit and then output therefrom. In this instance, the number of digits for conversion is a predetermined sequence of four digits or so, and in the case of voltage conversion of, for example, a 1.2345 μs pulse width, a voltage corresponding to the value of the low order four digits 2345, the least significant digit of which is 100 ps, is provided, that is, the voltage output is yielded with no information of the most significant digit being taken into account. This does not matter when it is necessary to analyze the pulse width fluctuation, i.e. the frequency component of the jitter and the pulse width of the input pulse is preknown.

Since the magnitude of the jitter relative to the pulse width is often required, it is necessary to measure the pulse width of the input pulse when it is unknown. Moreover, in the case where input pulses of different pulse widths are provided and it is desirable to detect the frequency component of a jitter corresponding to each pulse width or the distribution of frequency of the jitter with respect to the pulse width, it is necessary to measure the pulse width.

To this end, the conventional jitter analyzer shown in FIG. 1 is provided with a pulse width measuring part 5, wherein the width of the output pulse from the time window 2 is measured. The pulse width measuring part 5 can be operated in synchronism with the sample-hold timing of the T-V converter 3, since the timing period with which pulses of a fixed width are extracted is not always constant when the time window 2 is used, the measuring cycle is not constant, in general, that is, the measurement dead time varies. This means that the sample-hold timing in the T-V converter 3 does not become constant, and therefore it is impossible to use, as a sampling clock for fast Fourier transformation, a signal synchronized with the sample-hold in the T-V converter 2. Accordingly, the FFT analyzer 4 has an independent sampling clock of a fixed interval. In other words, the T-V converter 3 and the pulse width measuring part 5 can be operated with the same measuring cycle, but the FFT analyzer 4 needs to be operated with a different measuring cycle. Hence, the jitter analyzer calls for complicated control.

In addition, as mentioned above, the T-V converter 3 includes a D-A converter and a sample-hold circuit, whereas the FFT analyzer 4 includes a sample-hold circuit and an A-D converter. Thus, the prior art analyzer is, in its entirety, wasteful or uneconomical in construction.

SUMMARY OF THE INVENTION

It is therefore an object of the present invention to provide a jitter analyzer which does not require a time window and a T-V converter as hardware nor a sampling clock for Fourier transformation, and hence is simple and economical in construction.

According to the present invention, the one edge of an input pulse is applied to a successive period measuring circuit, wherein the period of the edge is measured in succession, and the time interval from the said one edge to the other of the input pulse, i.e. the pulse width of the input pulse, is measured by a time interval measuring circuit. Upon each provision of measured data from the successive period measuring circuit and the time interval measuring circuit, it is stored in a memory. Based on the measured period data stored in the memory, time interval data which can be regarded to have been obtained at equal time intervals is computed from the measured time interval data, and a fast Fourier transform (FFT) is conducted in connection with the thus computed time interval data.

The pulse width of each pulse is provided from the time interval measuring circuit and each component of a pulse width jitter is analyzed by the FFT analysis. These values can be used to obtain the percentage of the jitter with respect to the pulse width. The percentage, the pulse width and the jitter component can be displayed.

BRIEF DESCRIPTION OF THE DRAWINGS

FIG. 1 is a timing chart for explaining the operation for measuring the time difference between the two input signals when the skip signal is generated.

DESCRIPTION OF THE PREFERRED EMBODIMENTS

Figure 2:
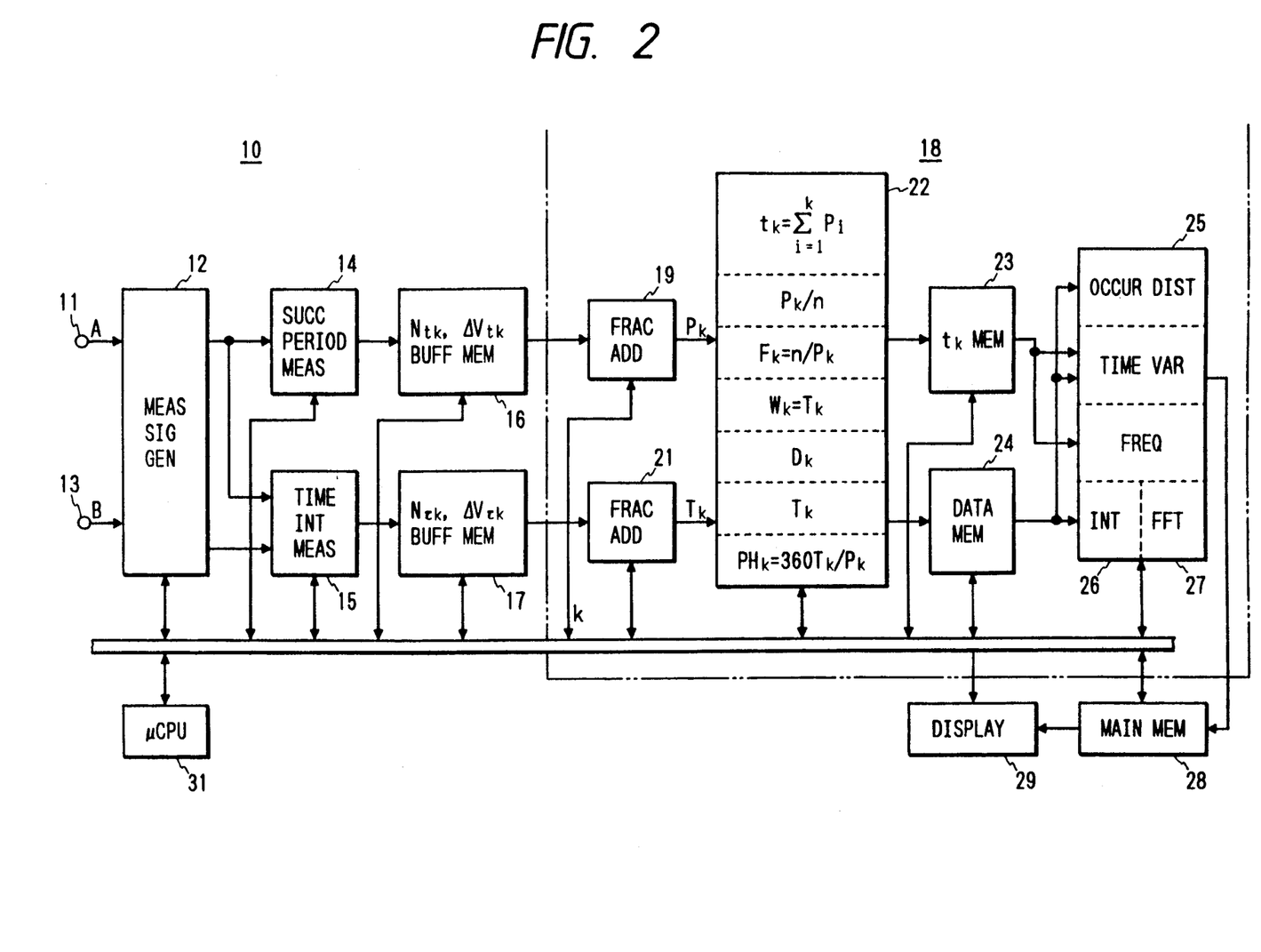
FIG. 2 is a block diagram illustrating an embodiment of the present invention.

FIG. 2 illustrates in block form an embodiment of the present invention. In a measuring part 10 input pulses A are supplied via an input terminal 11 to a measuring signal generator 12, and input pulses B, which are delayed versions of the input pulses A, are provided via an input terminal 13 to the measuring signal generator 12. From the measuring signal generator 12 the one edge of each input pulse A is applied to the input of a successive period measuring circuit 14 and the one input of a time interval measuring circuit 15, and the other edge of each input pulse A or the one edge of each input pulse B is supplied to the other input of the time interval measuring circuit 15.

Figure 3:
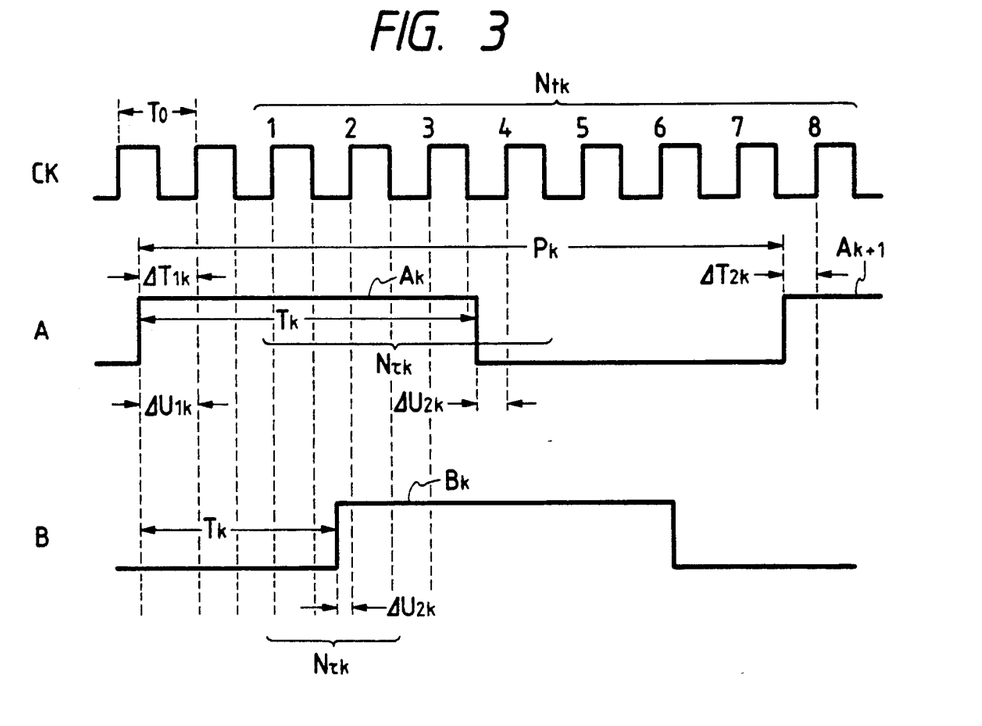
FIG. 3 is a timing chart for explaining the operation of each of a successive period measuring circuit and a time interval measuring circuit in the FIG. 2 embodiment.

The successive period measuring circuit 14 measures a parameter which defines the period of the pulse input thereinto, and each time the measured period parameter data is provided, it is stored in a buffer memory 16. The successive period measuring circuit 14 may be such as disclosed in U.S. Pat. No. 4,769,798 issued to the inventor of this application. According to the U.S. patent, assuming that one period to be measured $P_k$ covers a period from the one edge (for example, the rise) of a certain inner pulse $A_k$ to the one edge (the rise) of the next input pulse $A_{k+1}$, as shown in FIG. 3, a constant voltage is integrated for a period $\Delta T_{1k}$ from the rise of the first pulse $A_k$ to a reference clock pulse CK (of a period $T_0$) immediately thereafter and for a period $\Delta T_{2k}$ from the rise of the next pulse $A_{k+11}$ to the reference clock pulse immediately thereafter, whereby voltage corresponding to these periods are obtained (which voltages will hereinafter be identified by the same reference notations as the periods $\Delta T_{1k}$ and $\Delta T_{2k}$) Then, a difference between these voltages, $T_{tk} = \Delta T_{1k} - \Delta T_{2k}$, is obtained. Since the voltage difference corresponds to a fraction when expressing the period $P_k$ in units of the clock period $P_k$, it will hereinafter be referred to as a fraction of the period or simply as a fraction.

In the afore-mentioned U.S. patent, the number $N_{tk}$ of rises of the reference clock pulse CK in the time interval from the end of the period $\Delta T_{1k}$ to the end of the period $\Delta T_{2k}$ is counted, the count value is converted by a D-A converter to a voltage $V_k$, which is added to the above-mentioned voltage difference $\Delta V_{tk}$ corresponding to a fraction of the period, and the added value is sampled and held, thereafter being output as a voltage corresponding to the period $P_k$. The successive period measuring circuit 14 in this embodiment does not add the count value $N_{tk}$ and the fraction $\Delta V_{tk}$ but instead stores them as data for a parameter which defines the period. That is, the count value $N_{tk}$ of the reference clock pulse CK is not converted to analog form, but instead the difference voltage $\Delta V_{tk}$ is sampled and held, and the resulting output $\Delta V_{tk}$ is converted by an A-D converter to a digital value (which will hereinafter be identified by the same reference character as the analog value $\Delta V_{tk}$) The count value $N_{tk}$ and the digital value $\Delta V_{tk}$ are stored, as parameter data (hereinafter referred to simply as a period parameter) for defining the period $P_k$, in the buffer memory 16. Since such a simple modification of the invention disclosed in the above-said U.S. patent can easily be accomplished by those skilled in the art, no description will be given thereof with reference to the drawings.

The time interval measuring circuit 15 measures a parameter which defines the time interval $T_k$ (i.e. the pulse width $W_k$) from the one edge (for example, the rise) of the pulse $A_k$ applied via the terminal 11 to the other edge (i.e. the fall) of the pulse $A_k$. Alternatively, the time interval measuring circuit 15 measures a parameter which defines the time interval $T_k$ (i.e. a time difference) between the one edge of the input pulse A applied to the terminal 11 and the corresponding edge of the input pulse B applied to the terminal 13. Either of the parameters will hereinafter be referred to simply as an interval parameter. Each time the interval parameter is measured, it is stored in a buffer memory 17. As is the case with the successive period measuring circuit 14, the time interval measuring circuit 15 may be formed as a modification of the technique disclosed in Japanese Patent Public Disclosure No. 294998/87, for instance. Also in this case, as shown in FIG. 3, the parameter for the time interval $T_k$ is measured, in digital form, as a difference (hereinafter referred to as a fraction of the time interval or simply as a fraction), $\Delta V_{\tau k} = \Delta U_{1k} - \Delta U_{2k}$, between a period $\Delta U_{1k}$ from the one edge of each input pulse A to the reference clock immediately subsequent thereto to a period $\Delta U_{2k}$ from the other edge of the input pulse (or the one edge of the input pulse B applied to the terminal 13) and as the number, $N\tau_k$, of rises of the reference clock pulses in the time interval from the end of the period $\Delta U_{1k}$ to the end of the period $\Delta U_{2k}$. The sum of the values $N\tau_k$ and $\Delta V\tau_k$ corresponds to the time interval $T_k$ and they are stored in the buffer memory 17 as the interval parameter data which defines the time interval $T_k$.

In a calculation part 18, the period $P_k$ is obtained from the period parameters $N_{tk}$ and $\Delta V_{tk}$ stored in the buffer memory 16, by conducting the following calculation in a fraction adding part 19.

$$P_k = T_0 N_{tk} + \Delta V_{tk}/C \tag{1}$$

where C is a coefficient for converting the value $\Delta V_{tk}$ to a fraction of the reference clock period $T_0$. Similarly, the interval parameters $N\tau_k$ and $\Delta V\tau_k$ in the buffer memory 17 are used to obtain the time interval $T_k$ by conducting, for example, the following calculation in a fraction adding part 21.

$$T_k = T_0 N\tau_k + \Delta V\tau_k/C \tag{2}$$

Figure 4:
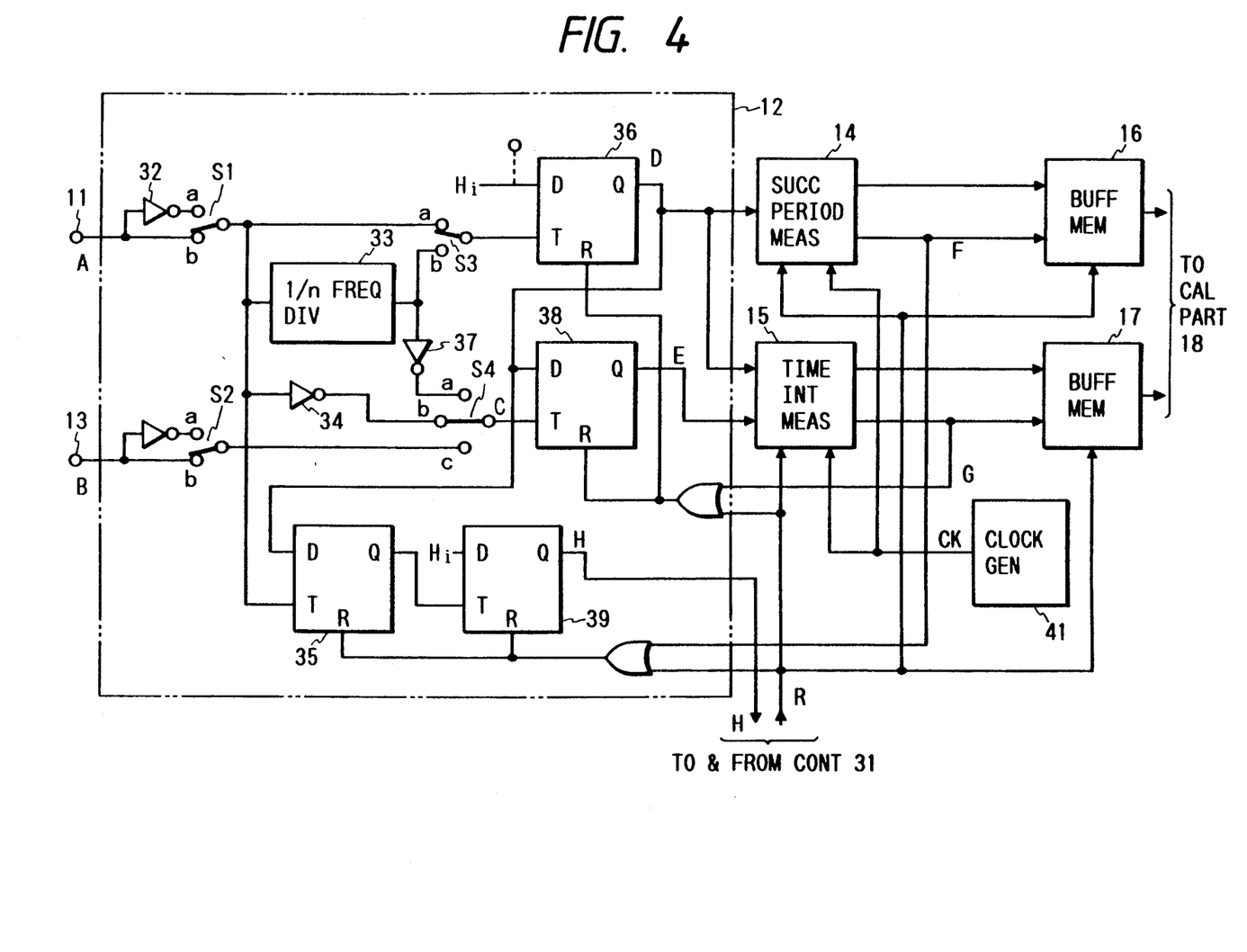
FIG. 4 is a block diagram showing a specific operative example of a measuring part 10 in FIG. 2.

As required, a period $P_k/n$ (where n is the frequency dividing number of a frequency divider 33 in FIG. 4), a frequency $F_k = n/P_k$, the pulse width $W_k = T_k$, a duty ratio $D_k = 100 \times W_k/P_k$, an input time difference between the input pulses $A_k$ and $B_k$, and the phase difference, $PH_k = 360 \times T_k/P_k$, between the input pulses $A_k$ and $B_k$ are obtained in a data or measured calculation part 22. The period data $P_k$ is stored in an elapsed time memory 23 after being accumulated, and the other data or measurands $F_k$, $W_k$, $D_k$, $T_k$ and $PH_k$ are stored in a data or measurand memory 24.

In an interpolation operation part 26 of an analysis operation part 25, for example, in the case of analyzing a pulse width jitter, a series of pulse widths, which can be regarded to have been obtained at a predetermined equal time interval (corresponding to the sampling period for digital Fourier transform) is computed, by a method described later, from the pulse width data $W_k$ read out of the data memory 24. The pulse width data thus computed is subjected to a digital Fourier transform in an FFT part 27. In this way, the frequency component, occurrence distribution and time variation of the pulse width jitter are obtained, and they are stored in a main memory 28 and displayed on a display 29. Switches S1 to S4 in the measuring signal generator 12, the buffer memories 16 and 17, the fraction adding parts 19 and 21, the data calculation part 22, the memories 23 and 24, the analysis operation part 25, the main memory 28 and the display 29 are placed under the control of a controller 31 which is formed by a microcomputer.

Next, a detailed description will be given of each part of this embodiment. It is desired that the measuring part 10 be capable of acquiring data in succession with a minimum dropout and accurately detecting the time of data acquisition (an elapsed time). FIG. 4 shows a specific operative example of the measuring signal generator 12. The input terminal 11 is connected to the one fixed contact b of the switch S1 and to the other fixed contact a of the switch S1 via an inverter 32. The switch S1 has its movable contact connected to a fixed contact a of the switch S3, a frequency divider 33, an inverter 34 and a trigger terminal T of a D flip-flop 35. The switch S3 has its movable contact connected to a trigger terminal T of a D flip-flop 36. The output of the frequency divider 33 is connected to a fixed contact b and an inverter 37, the inverters 34 and 37 are connected to fixed contacts b and a of the switch S4, respectively, and a movable contact of the switch S4 is connected to a trigger terminal T of a D flip-flop 38. The input terminal 13 is connected to the one fixed contact b of the switch S2 and to the other fixed contact a via an inverter, and the switch S2 has its movable contact connected to a fixed contact c of the switch S4.

A high level Hi is provided to a data terminal D of the D flip-flop 36, and its the output terminal Q is connected to the inputs of the successive period measuring circuit 14 and the time interval measuring circuit 15 and to data terminals D of the D flip-flops 38 and 35. The output terminal Q of the D flip-flop 38 is connected to the other input terminal of the time interval measuring circuit 15, and the output terminal Q of the D flip-flop 35 is connected to a trigger terminal T of a D flip-flop 39. The high level Hi is provided to a data terminal D of the D flip-flop 39 and the output at its output terminal Q is provided as a skip signal H to the controller 31.

In the successive period measuring circuit 14, the fraction $V_{tk}$ is sampled and held for conversion to digital form as mentioned previously and then a reset pulse F is applied to an integration circuit which converts an odd or fractional time to a voltage. The pulse F is used also as a write pulse for writing the period parameters $N_{tk}$ and $\Delta T_{tk}$ into the buffer memory 16 and to reset the D flip-flops 35 and 39. Also in the time interval measuring circuit 15, the fraction $\Delta T\tau_k$ is similarly sampled and held for conversion to digital form and then a reset pulse G is applied to an integration circuit which converts an odd or fractional time to a voltage. The pulse G is used also as a write pulse for writing the interval parameters $N\tau_k$ and $\Delta V\tau_k$ into the buffer memory 17 and to reset the D flip-flops 36 and 38. The successive period measuring circuit 14 and the time interval measuring circuit 15 are both supplied with the reference clock pulse CK of the period $T_0$ from a clock generator 41.

Figure 5:
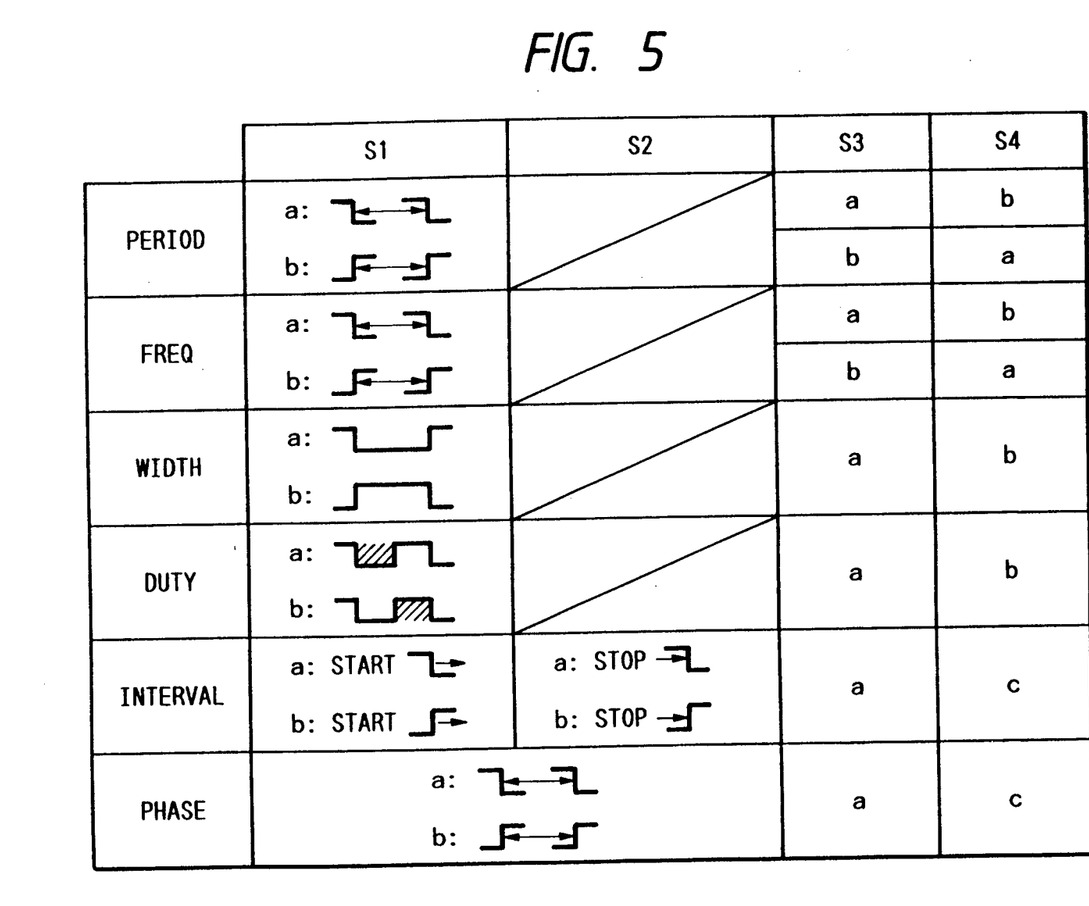
FIG. 5 is a table showing the relationships between the kinds of measurement and the states of control of switches in a measuring signal generator in FIG. 4.
Figure 6:
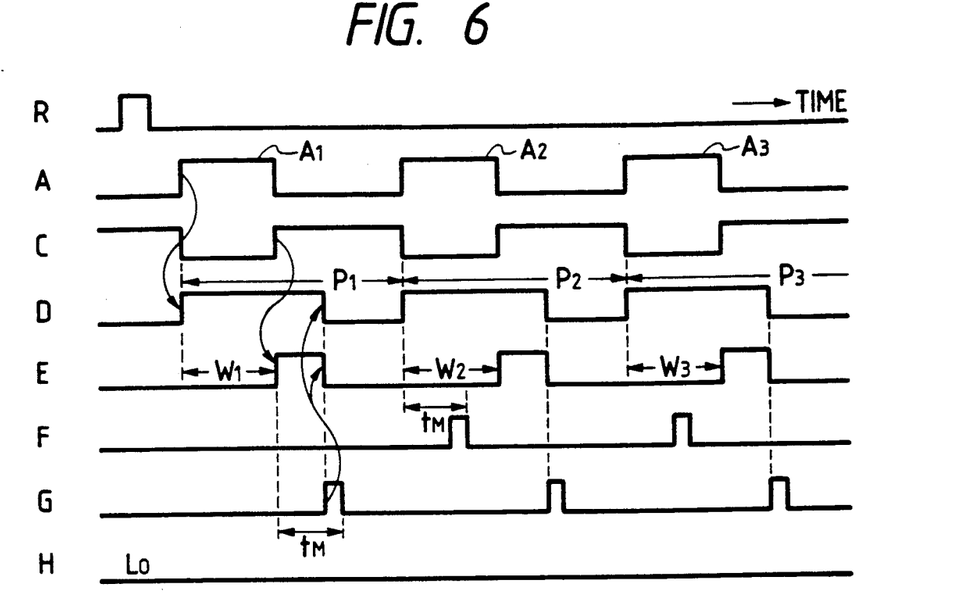
FIG. 6 is a timing chart for explaining the operation for measuring the period and pulse width of an input pulse in the case where no skip signal is generated.

According to the purpose of measurement, the switches S1 to S4 are placed in such a states as shown in FIG. 5, under the control of the controller 31. For example, in the period and frequency measurements which do not call for the frequency division by the frequency divider 33, the switches S1 and S2 are both connected to the fixed contacts b, the switch S3 the fixed contact a and the switch S4 the fixed contact b as shown in FIG. 4. As depicted in FIG. 6, a reset pulse R is provided, after which the D flip-flop 36 is triggered by the positive edge (i.e. positive-going or leading edge) of an input pulse $A_1$ and its Q output D rises. On the other hand, the D flip-flop 38 is triggered by the next positive edge of an output C which is an inverted version of the input pulse $A_1$ by the inverter 34, and as a result, the Q output E of the flip-flop 38 rises. The period $W_1$ from the time of rise of the Q output D of the D flip-flop 36 to the time of rise of the Q output E of the D flip-flop 38 is measured by the time interval measuring circuit 15. A certain elapsed time $t_M$ after the measured positive-going edge of the Q output E, the Write pulse G is generated, by which the interval parameters $N\tau_i$ and $V\tau_1$ are written into the buffer memory 17 and the D flip-flops 36 and 38 are reset. Upon the rise of the next input pulse $A_2$ the same operations as described above are repeated. In this case, no skip signal is produced.

Figure 7:
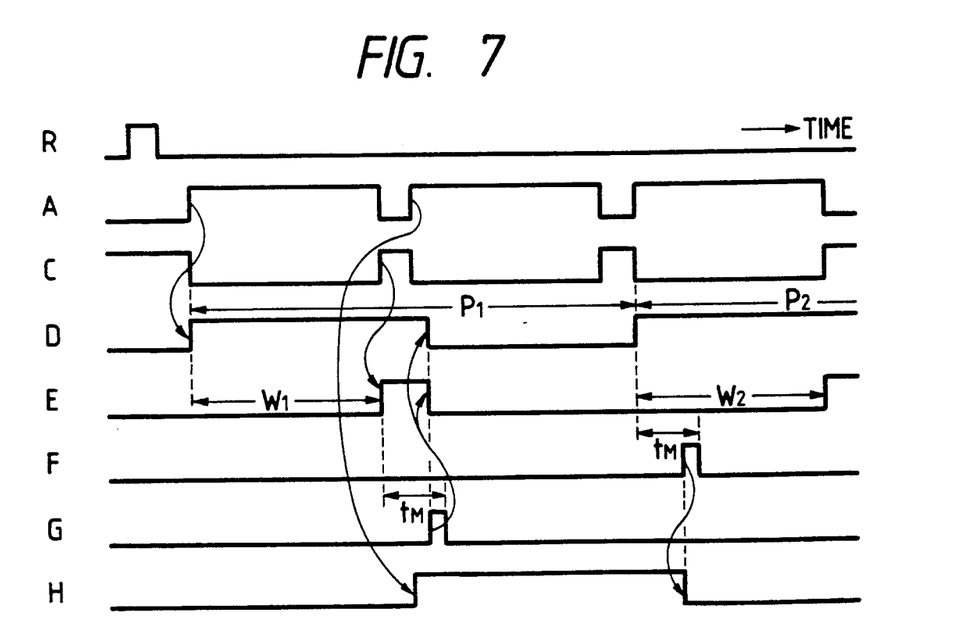
FIG. 7 is a timing chart for explaining the operation for measuring the period and pulse width of the input pulse in the case where the skip signal is generated.

The intervals between adjacent positive edges of the input pulses $A_k$, that is, periods $P_1$, $P_2$, $P_3$, ... are measured by the successive period measuring circuit 14, and the time $t_M$ after each positive edge of the Q output D of the flip-flop 36 the write pulse F is generated, by which the period parameters $N_{tk}$ and $V_{tk}$ are written into the buffer memory 16. The period measurement does not require the measurement of time intervals, but since any particular mechanism for stopping the time interval measuring operation need not be added, the time interval measuring circuit 15 is allowed to operate during the period measurement. FIG. 6 shows the case where $P_k > W_k + t_M$ and periods can be measured in succession, but when $P_k \leq W_k + t_M$, for example, as shown in FIG. 7, the next input pulse rises before the write pulse G is generated, that is, before the flip-flop 36 is reset, and consequently, the flip-flop 36 cannot detect the rise of the said next input pulse, with the result that two continuous periods are measured. In this instance, while the high-level Q output of the D flip-flop 36 is being applied to the data terminal D of the flip-flop 35, the positive-going edge of the next input pulse is provided to the trigger terminal T of the flip-flop 35, and consequently, its Q output goes high and triggers the flip-flop 39, generating the skip signal H once. The signal H is applied to the controller 31. When the period $P_k$ is shorter than the period $t_M$, two or more periods are joined together, during which the skip signal H is generated once, but the number of periods being joined is unknown. By connecting the switch S3 to the contact b and the switch S4 to the contact a and changing the frequency dividing number n of the frequency divider 33 in a sequential order of 2, 3, ..., it can be known that the value of the number n at which the skip signal H is no longer generated is the number of periods being joined together.

In the case of the pulse width measurement, the time interval measuring circuit 15 measures the time interval between the rise of the output D from the D flip-flop 36 and the rise of the output E from the D flip-flop 38 shown in FIG. 6 and then measures the pulse widths $W_1$, $W_2$, $W_3$, ... of the input pulses $A_1$, $A_2$, $A_3$, ... one after another. By this, the pulse width of every pulse can be measured when the pulse width $W_k$ is smaller than $(P_k - t_M)$. In the case where $W_k \geq (P_k - t_M)$, the next input pulse already risen when the write pulse G is generated after the output E of the D flip-flop 38 rose, the pulse width was measured and the measured data was obtained, as depicted in FIG. 7 corresponding to FIG. 6. Hence, the pulse widths are not successively measured in this case but the pulse width of every other pulse is measured. As regards the periods, they are measured two by two as one continuous period. Moreover, since the next input pulse rises prior to the generation of the write pulse G as mentioned above, that is, since the next input pulse rises prior to the resetting of the D flip-flop 36, the D flip-flop 39 is triggered by the rise of the said next input pulse, and consequently its output H rises and is provided as the skip signal to the controller 31. In other words, the D flip-flop 39 counts one input of the rise of the next input pulse while the output of the D flip-flop 36 remains high.

It is also possible to use the write pulse G to write the state of the Q output H of the D flip-flop 39 into the buffer memory 17 without supplying the Q output (i.e. the skip signal) H of the D flip-flop 39 to the controller 31. By employing a counter as a substitute for the D flip-flop 39 to count the Q output of the D flip-flop 35, the number of pulses which cannot be measured one after another by the time interval measuring circuit 15 is counted by the counter. Since the D flip-flops 36 and 38 operate in cascade, the minimum pulse width that can be measured in FIG. 4 is determined by the sum of the delay time of the flip-flop 36 and the setup time of the flip-flop 38 (i.e. by their cascade-operation time). The D flip-flops 36 and 38 can be implemented which provide a cascade-operation time of around 5 nS.

The buffer memories 16 and 17 are each formed as a double buffer, which has a construction in which while a write is effected in the one buffer, the other buffer is read out, that is, the write and read are effected alternately with each other so as to ensure successive writing of measured data without any dropouts. It is also possible to effect the read at a higher rate than the write so that after the readout of a buffer, a required operation can be conducted while a write is effected in the buffer next. In the case where the measurement is started in synchronization with an external signal, an external start signal is applied to the data terminal D of the D flip-flop 36 and the measurement is terminated by the write pulse G from the time interval measuring circuit 15.

Figure 8:
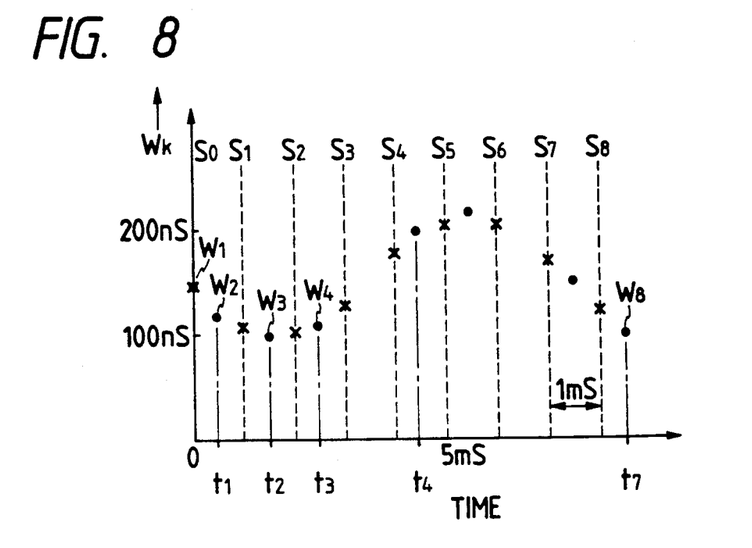
FIG. 8 is a graph showing pulse width variations with the lapse of time.

In the fraction adding part 19 or 21 of the calculation part 18 the afore-mentioned Eqs. (1) and (2) are calculated. The measured period data $P_1$, $P_2$, $P_3$, ... obtained in the fraction adding part 19 are provided to the data calculation part 22, in which they are added with their preceding measured values for each measuring cycle, and the added values are sequentially stored as $P_1 = t_1$, $P_1 + P_2 = t_2$, $P_1 + P_2 + P_3 = t_3$, ... in the elapsed time memory 23. These times $t_1$, $t_2$, $t_3$, ... are representative of elapsed times after the start of measurement of the first input pulse following the resetting of the flip-flops. At time 0 the measurement of the pulse width $W_1$ is started; at time $t_1$ the measurement of the pulse width $W_2$ started; and at time $t_2$ the measurement of the pulse width $W_3$ is started. Since the period $P_k$ of the input pulse varies, measured pulse width $W_k$ is obtained at irregular time intervals as depicted in FIG. 8, wherein each pulse width $W_k$ is indicated at the time point when the pulse started.

Figure 9:
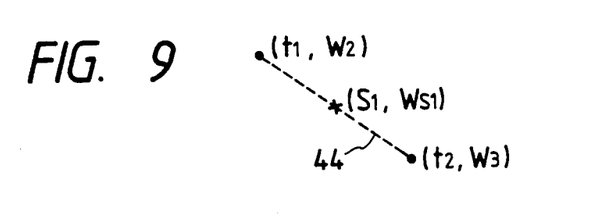
FIG. 9 is a diagram for explaining a linear interpolation.

The most striking feature of the present invention is that, for the frequency analysis of fluctuations (or jitters) of the pulse width $W_k$ and the period $P_k$, period data $P_{sk}$ and pulse width data $W_{sk}$, which can be regarded as having been measured at regular time intervals of, say, 1 mS, are computed from the measured period data $P_k$ and the measured pulse width data $W_k$ in the interpolation part 26. A description will be given in conjunction with the case where pulse data, which can be regarded as having been obtained by measuring pulse widths at sampling points $S_0$, $S_1$, $S_2$, ... at regular time intervals starting at time 0 as shown in FIG. 8, are obtained through use of a linear interpolation method, for instance. The coordinates $(t_{k-1}, W_k)$ of the pulse width data $W_k$ at eight measuring time points can be represented by $(0, W_1)$, $(t_1, W_2)$, $(t_2, W_3)$, $(t_3, W_4)$, ..., $(t_7, W_8)$, respectively. It is a matter of course that the pulse width at the sampling point $S_0$ is $W_1$. The coordinates $(S_1, W_{s1})$ at the sampling point $S_1$ is obtained as described below. Assuming that a straight line 44 passing through three points $(t_1, W_2)$, $(S_1, W_{s1})$ and $(t_2, W_3)$ depicted in FIG. 9 is $W = At + B$, $$A = (W_2 - W_3)/(t_1 - t_2)$$

$$B=(t_1W_3-t_2W_2)/(t_1-t_2)$$

Substitution of A, B and $S_1$ into the expression of the straight line gives $$W_{s1}=S_1(W_2-W_3)/(t_1-t_2)+(t_1W_3-t_2W_2)/(t_1-t_2)$$

Thus, the pulse width $W_{s1}$ at the sampling point $S_1$ is obtained. Similarly, the pulse widths $W_{s2}$, $W_{s3}$, $W_{s4}$, . . . are obtained.

Figure 10:
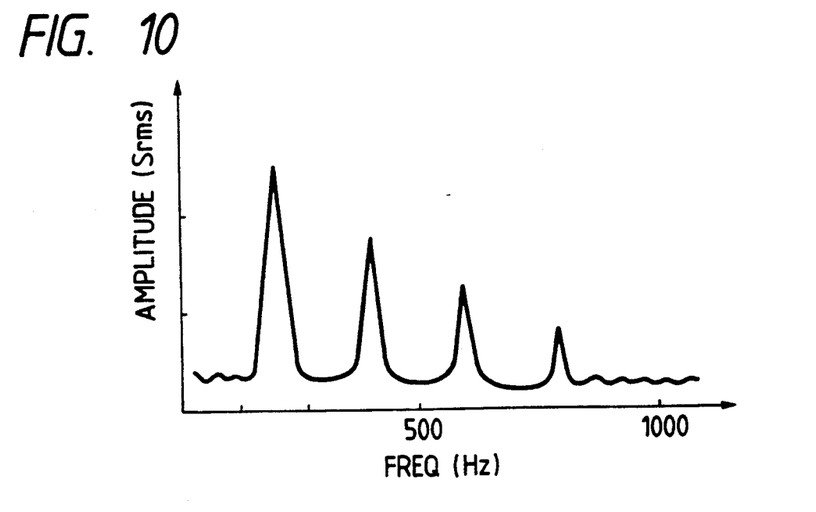
FIG. 10 is a graph showing an example of the frequency spectrum of a pulse width jitter.

The pieces of pulse width data $W_{sk}$ (indicated by crosses in FIG. 8) thus obtained at regular time intervals are subjected to the fast Fourier transform in the FFT part 27. The resulting frequency spectrum is displayed on the display 29 as shown in FIG. 10, for instance. The frequency components of the fluctuation (i.e. jitter) of pulse widths $W_k$ can be known from such a display. In this case the values of the all pulse widths $W_k$ or the mean value thereof can also be displayed at the same time. To increase the precision of the pieces of pulse width data $W_{sk}$ which can be regarded as having been obtained at regular time intervals, the Lagrange's interpolation formula and some other interpolation methods can be used in place of the linear interpolation method.

As regards the measured period data $P_k$, too, pieces of period data $P_{sk}$ which can be regarded as having been obtained at regular time intervals are computed and they are subjected to the fast Fourier transform. By this, the frequency components of the pulse repetition period jitter can be detected and, further, the percentage of the jitter with respect to the period can also be obtained. In this instance, since the pulse width $W_k$ need not be measured, it is evident that the input pulse to the terminal 11 is provided directly to the successive period measuring circuit 14 and that the measuring signal generator 12, the time interval measuring circuit 15, the buffer memory 17 and the fraction adding part 21 can be omitted.

Figure 11:
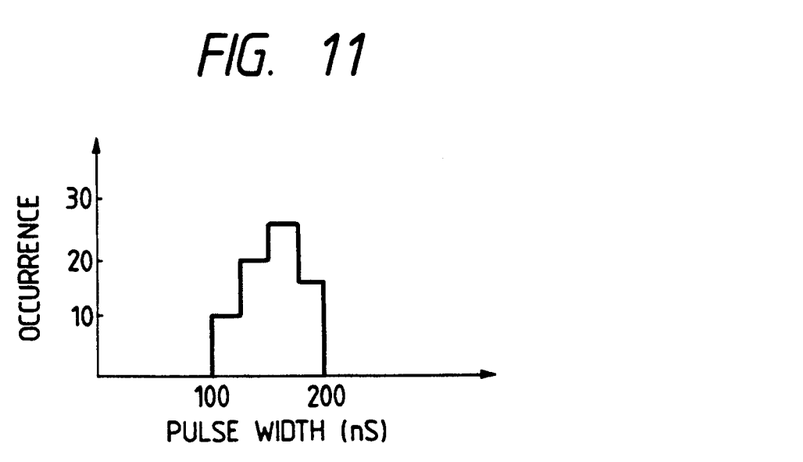
FIG. 11 is a graph showing, by way of example, a display of the frequency distribution of measured amounts.
Figure 12:
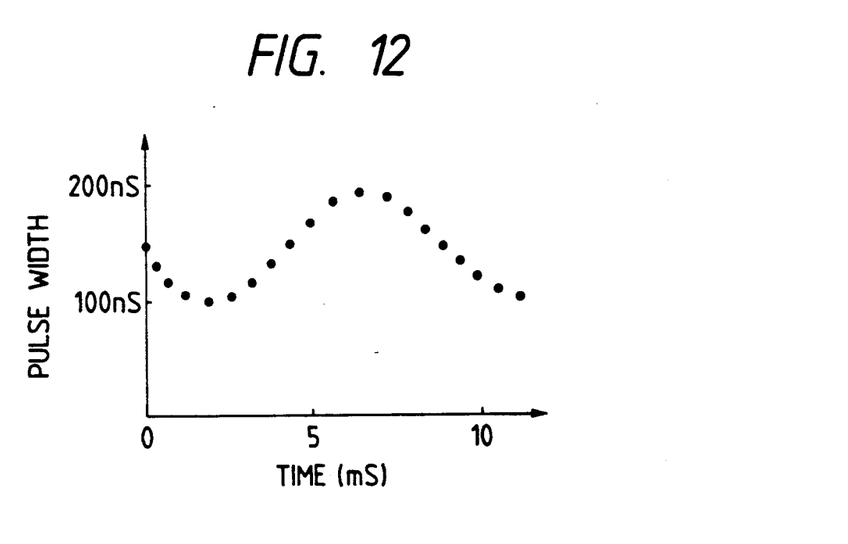
FIG. 12 is a graph showing, by way of example, a display of temporal variations of the measured amounts.

Next, a description will be given of functions with which the FIG. 2 embodiment is further equipped. It is also possible to display the distribution of occurrence of the pulse width $W_k$ as depicted in FIG. 11 wherein the abscissa represents the pulse width $W_k$ and the ordinate the number of individual pulse widths obtained (i.e. the frequency of occurrence). Alternatively, time variations of the pulse width $W_k$ as shown in FIG. 12 wherein the abscissa represents the elapsed time $t_k$ and the ordinate the pulse width $W_k$.

Since the duty ratio is pulse width/period $\times 100(\%)$, it is possible to obtain and display, in real time, values obtained by computing $W_1/P_1$ at time 0, $W_2/P_2$ at time $t_1$, $W_3/P_3$ at time $t_2$, . . . $W_k/P_k$ at time $t_k$ and multiplying them by 100. In the case where the skip signal is generated as depicted in FIG. 6, the period data $P_k$ is divided by $\alpha$ (where $\alpha$ is the number of skip +1) and the divided value is used for the calculation of the duty ratio.

Figure 13:
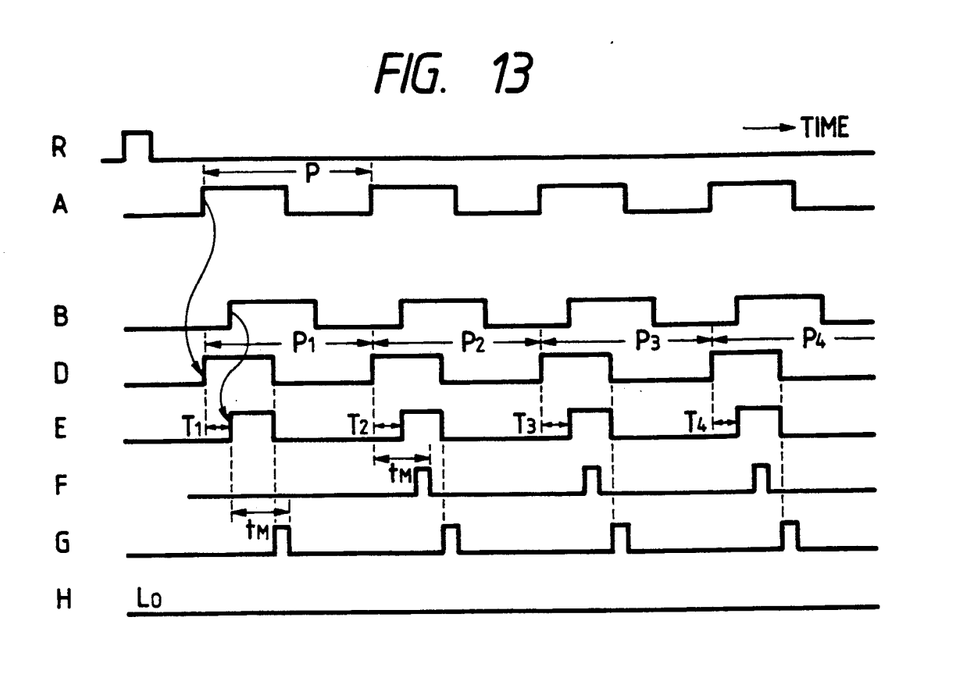
FIG. 13 is a timing chart for explaining the operation for measuring the time difference (or time interval) between two input signals when no skip signal is generated.

The time difference or time interval between specified edges of two signals A and B of the same rate is measured as described below. For example, in the case of measuring the time interval between positive edges of the signals as shown in FIG. 3, the switches S1 and S2 are both connected to the contacts b and the switches S3 and S4 are connected to the contact a and the contact c, respectively, in FIG. 4. Consequently, as shown in FIG. 13, the D flip-flop 36 is triggered by the rise of the input pulse A and its output D goes high, whereas the D flip-flop 38 is triggered by the rise of the next input pulse B and its output E goes high. The time difference $T_1$ between the rises of the D flip-flops 36 and 38 is measured by the time interval measuring circuit 15, from which the measured data is obtained, and then the D flip-flops 36 and 38 are reset by the write pulse G. Upon the rise of the next input pulse A, the same operation as mentioned above is repeated, the period $P_1$ is measured by the successive period measuring circuit 14 and the write pulse F for the measured data is generated, but when the time difference $T_k$ between the input pulses A and B is smaller than $(P_k-t_M)$ and larger than the cascade-operation time (5 nS, for instance) of the D flip-flops 36 and 38, the write pulse G is followed by the rise of the next input pulse A, and hence the time difference $T_k$ can be measured as shown in FIG. 13.

Figure 14:
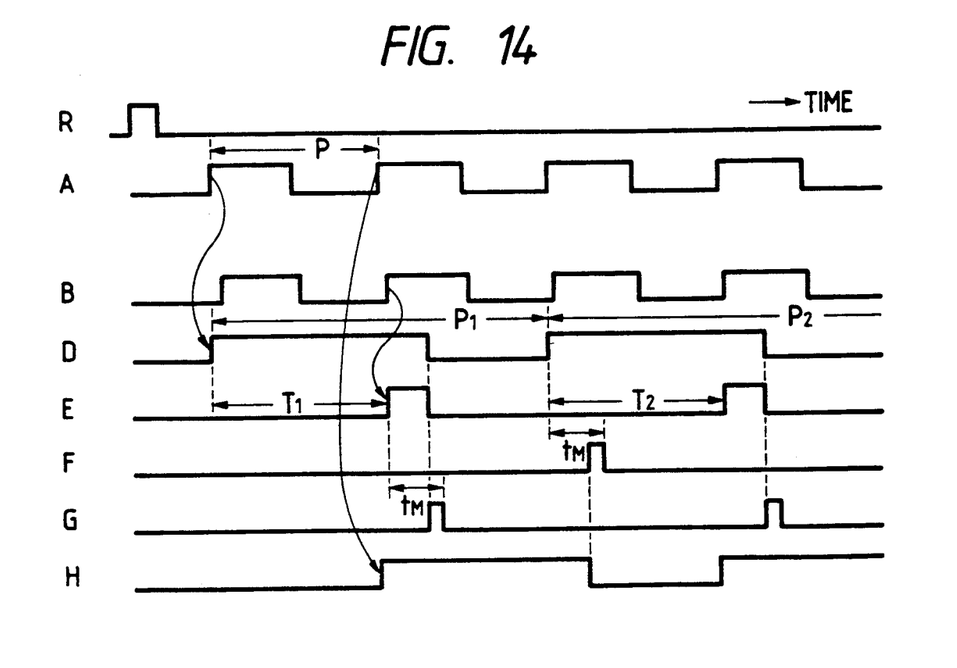

In the case where the time difference $T_k$ is smaller than 5 nS or larger than or equal to $(P_1-t_M)$, however, the next rise of the input pulse A occurs prior to the generation of the write pulse G for the measured data of the time difference $T_1$ as shown in FIG. 14. At this time the skip signal H is generated. In this instance, when $T_k \geq P_k-t_m$, pieces of data $T_1$, $T_2$, . . . obtained are used intact as measured data, whereas when $T_k \leq 5$ nS, pieces of data $T_1-(P_1/2)$, $T_2-(P_2/2)$, . . . are used as measured data. Either one of these measurands is used, for example, depending on whether $T_1$ is larger or smaller than $P_1/2$. In the afore-mentioned pulse width measurement the lower limit of the measurable pulse width is described to be 5 nS, but the pulse width can also be measured to the infinitesimal by adopting the same processing as that used for the time interval measurement.

The phase difference between the input pulses a and B can also be measured in the same manner as that for the time interval measurement. That is, when $5$ nS$<T_k<P_k-T_M$, the time difference $T_k$ is multiplied by $360/P_k$; when $T_k \leq 5$ nS, an operation $360 \times \{T_k-(P_k/2)\}/(P_k/2)$ is conducted for the time difference $T_k$; and when $T_k \geq P_k-t_M$, an operation $360 \times T_k/(P_k/2)$ is conducted.

Furthermore, a time window can easily be provided by software processing. For instance, in the case where pieces of data $W_1$, $W_2$, $W_3$, . . . are obtained at times 0, $t_1$, $t_2$, . . . , it is possible to select the pieces of data, for example $W_2$, $W_4$, . . . , within a predetermined range of variations of a desired pulse width under program control of the controller 31 and detect the time points of their occurrence $t_1$, $t_3$, . . . . Hence, jitters can be analyzed only for these pieces of pulse width data.

As for the above-described measured period data, duty ratio, time interval and phase as well, such displays as depicted in FIGS. 11 and 12 can be provided. The calculation part 18 is formed by dedicated computing equipment such as a digital signalling processor (DSP), or dedicated microcomputer. Alternatively, the microcomputer of the controller 31 may be used also to perform the function of the calculation part 18.

Incidentally, the analysis of the frequency components of a jitter has the following significance, for example, in connection with a reproduced signal from a compact disk player. The reproduced signal contains a medium jitter which is caused by nonuniformity or dropout of pits of the disk, a mechanical jitter which is wow and flutter or other mechanical vibration which is caused by a motor for driving the disk, and an electrical jitter which is generally known as a trigger error of a waveform shaping circuit. The electrical jitter depends on the ratio between the input signal slew rate and the input noise level, and its noise includes a conducting noise from a power supply or earth and an emitted noise propagating in space, in addition to a thermal noise. The reproduced signal is a coded digital signal and is decoded. The decoding circuit therefor can be regarded equivalently as a retiming circuit, and the condition on which no error is induced is that each edge of the reproduced signal does not have a jitter longer than $\pm\frac{1}{2}$ clock period.

Conventional error measuring equipment, which measures the number of errors or error rate, is of the type wherein no measuring object appears unless the jitter is larger than $\pm\frac{1}{2}$ clock period as mentioned above and when the jitter is smaller than it, an indication "error-free" is provided. Accordingly, when used as a jitter analyzer, such error measuring equipment is very inaccurate, and hence is impracticable. Moreover, some jitters are attributable to the property of the disk (i.e. the medium) as mentioned above. There is a case where even if the disk player is error-free for a specified disk (called a standard disk), an error is induced when playing back a disk of a poor property. It is necessary, therefore, to carefully measure and analyze the state of the player in which the error is induced, that is, its error-free state.

There have already been placed on the market a jitter counter for measuring the total amount of jitter and a jitter measuring apparatus for analyzing the aforementioned occurrence distribution and temporal changes of jitters. In the case where the jitter is brought about by various causes as usual, it is considered that the analysis of the frequency component of the jitter is indispensable.

To reduce the total amount of jitter when it is caused by a plurality of causative factors, it is an inviolable rule to remove the factors, starting with the most influential one. To determine which factor is most contributing to the jitter, there is no method but to ascertain the individual factors by the analysis of the frequency component of the jitter and compare them. The present invention permits such an analysis of the frequency component of the jitter.

As described above, according to the present invention, pulse widths and periods of input pulses are measured in succession, the measured period data is used to compute the time at which each pulse width was obtained, pieces of pulse width data which can be regarded to have been obtained at regular time intervals are calculated, and then the pieces of pulse width data are subjected to a fast Fourier transform. Thus, the present invention permits the analysis of the frequency components of the pulse width jitter and its pulse width as well with a relatively simple construction which does not involve two separate independent systems such as a pulse width measuring system and a measuring system for the fast Fourier transform.

It will be apparent that many modifications and variations may be effected without departing from the scope of the novel concepts of the present invention.

What is claimed is:

1. A jitter analyzer comprising:
   successive period measuring means supplied with one edge of each of a sequence of input pulses, for successively measuring the periods of said sequence of input pulses;
   time interval measuring means supplied with said one and the other edges of said sequence of input pulses, for measuring the time interval between said one edge and said other edge;
   memory means for storing measured period data and measured time interval data each time they are provided from said successive period measuring means and said time interval measuring means;
   means for computing time interval data at predetermined constant time intervals, by an interpolation method, from elapsed times defined by said measured period data stored in said memory means and said measured time interval data; and
   means for conducting a fast Fourier transform of said computed time interval data.

2. The jitter analyzer of claim 1 further comprising:
   a first D flip-flop, connected to said successive period measuring means, triggered by said one edge of said sequence of input pulses; and
   a second D flip-flop, connected to said first flip-flop, supplied at its data terminal with the output of said first D flip-flop and triggered by the other edges of said sequence of input pulses;
   wherein an output variation of said first D flip-flop is provided as said one edge to said successive period measuring means and said output variation of said first D flip-flop and an output variation of said second D flip-flop are provided as said one edge and said other edge to said time interval measuring means; and
   wherein said time interval measuring means generates a reset signal for resetting said first and second D flip-fops each time said measured time interval data is written into said memory means.

3. The jitter analyzer of claim 2, further comprising means for detecting the input of a next one of said input pulses prior to the resetting of said first and second D flip-flops after the measurement of said time intervals conducted for an arbitrary one of said sequence of input pulses and for generating a signal indicating that said measured period data covers the periods of said one input pulse and said next input pulse.

4. The jitter analyzer of claim 3, further comprising means for accumulating said measured period data in succession and outputting each accumulated value as said elapsed time.

5. The jitter analyzer of claim 3, further comprising:
   frequency dividing means for frequency dividing each of said input pulses down to 1/n, n being an integer, and outputting a frequency-divided pulse; and
   select means for selecting either one of said input pulse and said frequency-divided pulse and outputting it as said sequence of input pulses.

6. A jitter analyzer comprising:
   successive period measuring means supplied with a sequence of pulses, for successively measuring the periods of said sequence of pulses;
   means for computing period data, at predetermined constant time intervals, by an interpolation method, from said measured period data and elapsed times defined thereby; and
   means for conducting a fast Fourier transform of said computed period data.

7. The jitter analyzer of claim 1, further comprising means for accumulating said measured period data in succession and outputting each accumulated value as said elapsed time.

8. The jitter analyzer of claim 2, further comprising means for accumulating said measured period data in succession and outputting each accumulated value as said elapsed time.

9. The jitter analyzer of claim 1, further comprising:
frequency dividing means for frequency dividing each of said input pulses down to 1/n, n being an integer, and outputting a frequency-divided pulse; and
select means for selecting either one of said input pulse and said frequency-divided pulse and outputting it as said sequence of input pulses.

10. The jitter analyzer of claim 2, further comprising:
frequency dividing means for frequency dividing each of said input pulses down to 1/n, n being an integer, and outputting a frequency-divided pulse; and
select means for selecting either one of said input pulse and said frequency-divided pulse and outputting it as said sequence of input pulses.

* * * * *